United States Patent
Martin et al.

(10) Patent No.: US 11,133,397 B2
(45) Date of Patent: Sep. 28, 2021

(54) METHOD FOR FORMING LATERAL HETEROJUNCTION BIPOLAR DEVICES AND THE RESULTING DEVICES

(71) Applicant: GLOBALFOUNDRIES U.S. Inc., Santa Clara, CA (US)

(72) Inventors: Alexander Lee Martin, Saratoga Springs, NY (US); Jagar Singh, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 128 days.

(21) Appl. No.: 16/430,843

(22) Filed: Jun. 4, 2019

(65) Prior Publication Data

US 2020/0388696 A1 Dec. 10, 2020

(51) Int. Cl.
| | |
|---|---|
| *H01L 31/072* | (2012.01) |
| *H01L 29/66* | (2006.01) |
| *H01L 29/737* | (2006.01) |
| *H01L 21/285* | (2006.01) |
| *H01L 29/417* | (2006.01) |
| *H01L 21/033* | (2006.01) |
| *H01L 29/423* | (2006.01) |
| *H01L 29/16* | (2006.01) |

(52) U.S. Cl.
CPC .... *H01L 29/66242* (2013.01); *H01L 21/0337* (2013.01); *H01L 21/28518* (2013.01); *H01L 29/16* (2013.01); *H01L 29/41708* (2013.01); *H01L 29/42304* (2013.01); *H01L 29/737* (2013.01)

(58) Field of Classification Search
CPC .............. H01L 29/66242; H01L 29/16; H01L 29/41708; H01L 29/42304; H01L 29/737
See application file for complete search history.

(56) References Cited

U.S. PATENT DOCUMENTS

| | | |
|---|---|---|
| 5,430,318 A | 7/1995 | Hsu |
| 7,911,024 B2 | 3/2011 | Ho et al. |
| 8,557,670 B1 | 10/2013 | Cai et al. |
| 9,059,016 B1 | 6/2015 | Hekrnatshoar-Tabari et al. |
| 9,331,097 B2 | 5/2016 | Cai et al. |
| 9,748,369 B2 | 8/2017 | Liu |
| 9,905,668 B2 | 2/2018 | Singh |
| 2014/0154845 A1 | 6/2014 | Cai et al. |
| 2016/0071962 A1 | 3/2016 | Senapati et al. |
| 2019/0288064 A1* | 9/2019 | Miyazawa .......... H01L 29/1033 |

* cited by examiner

*Primary Examiner* — Samuel A Gebremariam
(74) *Attorney, Agent, or Firm* — Hoffman Warnick LLC

(57) ABSTRACT

One illustrative method of forming heterojunction bipolar devices includes, among other things, forming a first gate structure above an active semiconductor layer, forming a second gate structure adjacent a first side of the first gate structure, forming a third gate structure adjacent a second side of the first gate structure, forming an emitter of a bipolar transistor in the active semiconductor layer between the first gate structure and the second gate structure, forming a collector of the bipolar transistor in the active semiconductor layer between the first gate structure and the third gate structure, and forming a first base contact contacting the active region adjacent an end of the first gate structure, wherein a portion of the active semiconductor layer positioned under the first gate structure defines a base of the bipolar transistor.

17 Claims, 9 Drawing Sheets

METHOD FOR FORMING LATERAL HETEROJUNCTION BIPOLAR DEVICES AND THE RESULTING DEVICES

BACKGROUND

Field of the Disclosure

The present disclosure generally relates to the fabrication of semiconductor devices, and, more particularly, to a method for forming lateral heterojunction bipolar devices and the resulting devices.

Description of the Related Art

In modern integrated circuits, a very high number of individual circuit elements, such as field effect transistors in the form of CMOS, NMOS, PMOS elements and the like, are formed on a single chip area. In addition to the large number of transistor elements, a plurality of passive circuit elements, such as capacitors, resistors and the like, are typically formed in integrated circuits that are used for a plurality of purposes, such as for decoupling.

Bipolar junction transistors (BJT) are used for radio frequency (RF) applications due to favorable transconductance characteristics. Emerging technologies, such as Internet of Things (IOT), require low voltage devices. BJT devices have lagged behind complementary metal oxide semiconductor (CMOS) devices in performance advancements, such as in the area of operating frequency.

The present disclosure is directed to various methods and resulting devices that may address one or more of the issues identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming lateral heterojunction bipolar devices and the resulting devices. One illustrative method includes, among other things, forming a first gate structure above an active semiconductor layer, forming a second gate structure adjacent a first side of the first gate structure, forming a third gate structure adjacent a second side of the first gate structure, forming an emitter of a bipolar transistor in the active semiconductor layer between the first gate structure and the second gate structure, forming a collector of the bipolar transistor in the active semiconductor layer between the first gate structure and the third gate structure, and forming a first base contact contacting the active region adjacent an end of the first gate structure, wherein a portion of the active semiconductor layer positioned under the first gate structure defines a base of the bipolar transistor.

Another illustrative method includes, among other things, forming a gate structure above an active semiconductor layer, wherein the gate structure includes a first line portion, a first block portion positioned on a first end of the first line portion, and a second block portion positioned on a second end of the first line portion, wherein the first block portion defines a first opening exposing the active semiconductor layer, forming a first base contact in the first opening, forming an emitter of a bipolar transistor adjacent a first side of the first line portion, and forming a collector of the bipolar transistor adjacent a second side of the first line portion, wherein a portion of the active semiconductor layer positioned under the first line portion defines a base of the bipolar transistor.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a bipolar transistor. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 1:
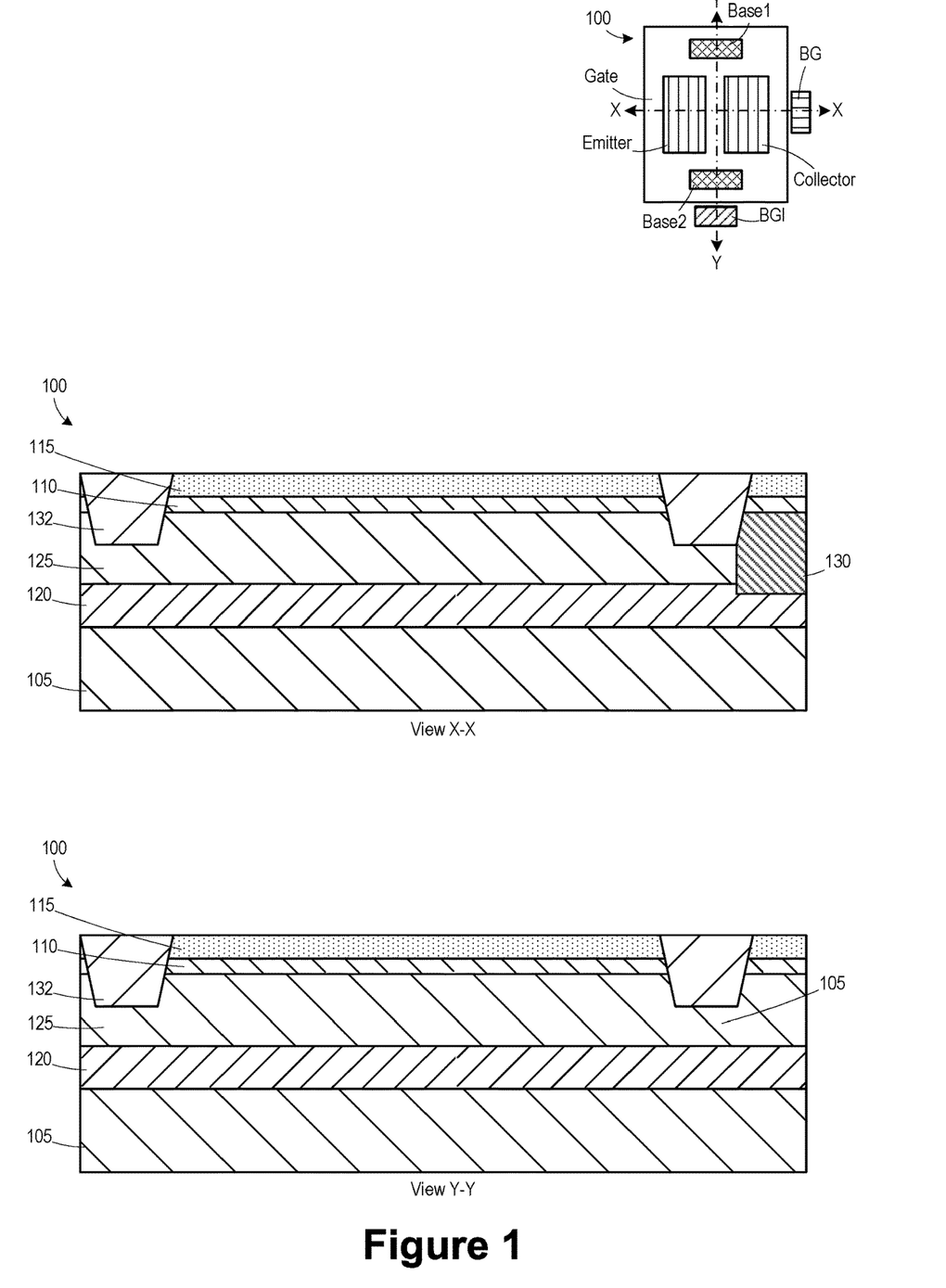
FIGS. 1-7 depict a method of forming a lateral heterojunction bipolar transistor device.

FIGS. 1-7 illustrate various novel methods disclosed herein for forming a bipolar transistor device 100, according to some embodiments. FIGS. 1-7 include a simplified plan view of the bipolar transistor device 100 illustrating where various cross-sectional views are taken. In the plan view, an "X-X" view is taken in a horizontal direction through an emitter, a base, and a collector of the bipolar transistor device 100, and a "Y-Y" view is taken in a vertical direction through base contacts and a base of the bipolar transistor device 100. For ease of illustration, not all features of the cross-sectional views are shown in the plan view. FIG. 1 shows cross-sectional views of the bipolar transistor device 100. The bipolar transistor device 100 may have a variety of configurations, such as the depicted silicon-on-insulator (SOI) configuration that includes a bulk substrate layer 105, a buried oxide (BOX) layer 110 (e.g., silicon dioxide) formed over the bulk substrate layer 105, and an active semiconductor layer 115 (e.g., silicon or silicon germanium) formed over the BOX layer 110. In some embodiments, the bulk substrate layer 105 is formed of silicon or silicon germanium or it may be made of materials other than silicon, such as germanium. In some embodiments, the active semiconductor layer 115 is formed of silicon or silicon germanium or some other semiconductor material. Thus, the terms "substrate" or "semiconductor layer" should be understood to cover all semiconducting materials and all forms of such materials. In some embodiments, portions of the active semiconductor layer 115 are silicon and portions are silicon germanium.

As shown in FIG. 1, one or more implantation processes were performed to form a well isolation region 120 (N−) in the bulk substrate layer 105 to define a back gate region 125 (P−) isolated from the bulk substrate layer 105 and to form a back gate isolation contact 130 (N+) contacting the well isolation region 120. Several processes were performed to define trenches in the bulk substrate layer 105, the BOX layer 110, and the active semiconductor layer 115 and to fill the trenches with a dielectric material (e.g., silicon dioxide) to form an isolation structure (STI) 132. Although only one back gate isolation contact 130 contacting the well isolation region 120 is illustrated, in some embodiments, multiple back gate isolation contacts are provided, such as in the Y direction.

Figure 2:
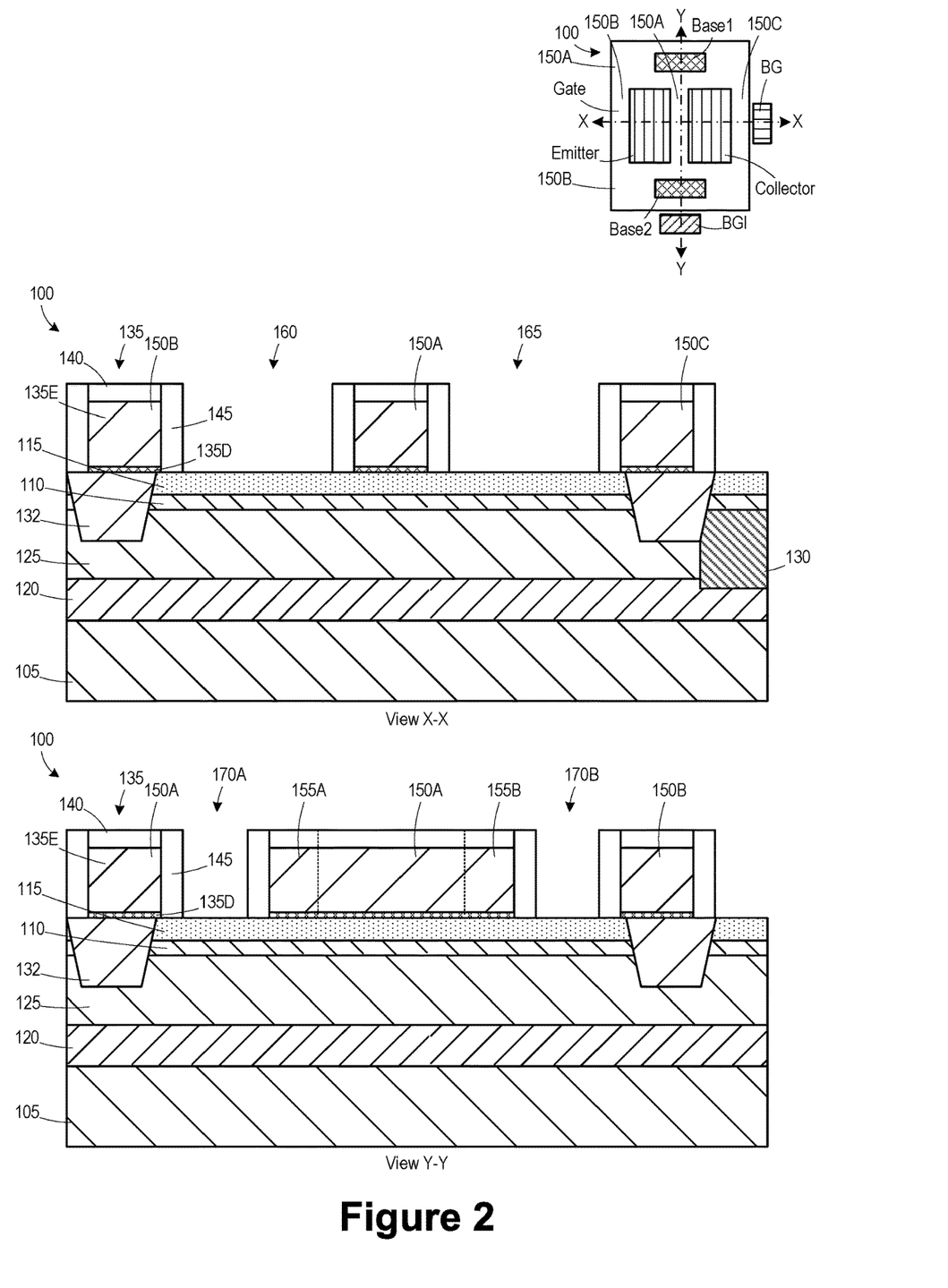

Referring to FIG. 2, a gate structure 135 is formed above the active semiconductor layer 115. In some embodiments, the gate structure 135 includes a gate dielectric layer 135D (e.g., silicon dioxide or a high-k dielectric, such as hafnium dioxide) and a gate electrode 135E (e.g., polysilicon). In some embodiments, a sacrificial gate structure is formed over the active semiconductor layer 115. In some embodiments, the sacrificial gate structure includes a sacrificial gate dielectric layer and a sacrificial gate electrode. The sacrificial gate structure is formed by forming layers of sacrificial material and forming a hard mask layer over the layers of sacrificial material. A patterning process is performed to pattern the hard mask layer corresponding to the pattern of the gate structure to be formed, and an etch process is performed using the patterned hard mask layer to etch the sacrificial layer to define the sacrificial gate structure. Remaining portions of the hard mask layer form a cap layer 140. In some embodiments, a sidewall spacer 145 is formed adjacent the gate structure 135. The sidewall spacer 145 is formed by depositing a conformal spacer layer over the gate structure 135 and performing an anisotropic etch process to remove portions of the spacer layer positioned on horizontal surfaces of the active semiconductor layer 115 and the cap layer 140. In some embodiments, the sidewall spacer 145 has the same material composition as the cap layer 140 (e.g., silicon nitride or other suitable material). In some embodiments, a gate replacement process is performed at a later point in the process flow to replace any sacrificial layers of the gate structure 135 with a gate dielectric layer (e.g., silicon dioxide, hafnium dioxide, or a different high-k material) and a conductive material (e.g., work function material layer, metal layer, etc.).

Referring to FIG. 2, the gate structure 135 includes a first line 150A, a second line 150B, and a third line 150C. A first block portion 155A is positioned adjacent first ends of the lines 150A-150C, and a second block portion 155B is positioned adjacent second ends of the lines 150A-150C, such that the lines 150A-150C extend between the block portions 155A, 155B. In some embodiments, the lines 150B, 150C at least partially overlap the isolation structure 132. The gate structure 135 defines perimeters around an emitter region 160 of the active semiconductor layer 115, a collector region 165 of the active semiconductor layer 115, a first base region 170A of the active semiconductor layer 115, and a second base region 170B of the active semiconductor layer 115. In some embodiments, only one base region 170A, 170B is formed in the gate structure 135.

Figure 3:
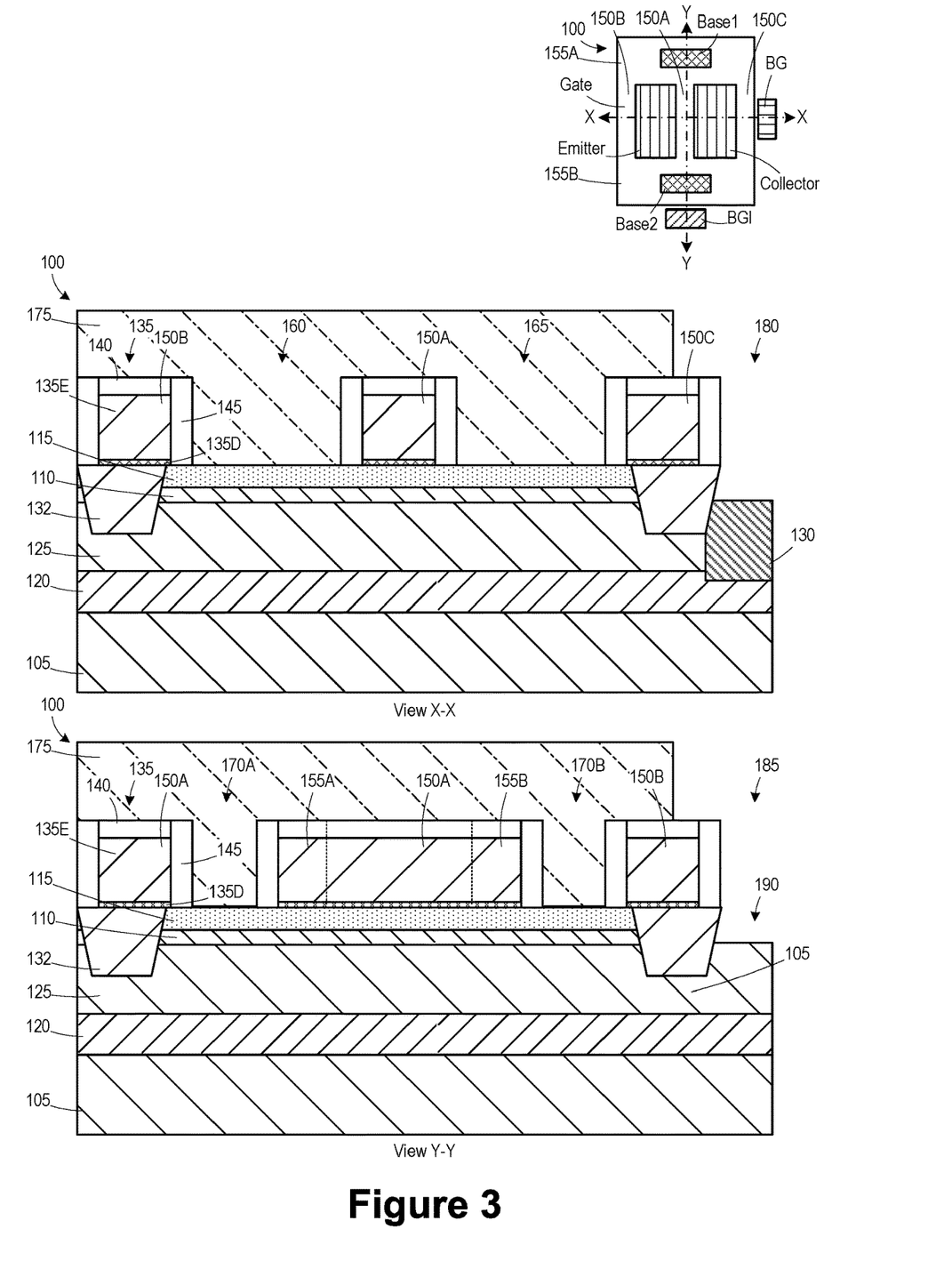

FIG. 3 illustrates the bipolar transistor device 100 after a mask layer 175 was formed above the bipolar transistor device 100 and patterned to define a first opening 180 over the back gate isolation contact 130 and a second opening 185 over a back gate contact region 190 and an etch process was performed to remove portions of the active semiconductor layer 115 and the BOX layer 110 exposed by the openings 180, 185. In some embodiments, the mask layer 175 includes one or more layers of a photolithography patterning stack, including a photoresist layer, an organic patterning layer (OPL), a hard bottom anti-reflective coating (BARC) layer, a hard mask layer. etc.

Figure 4:
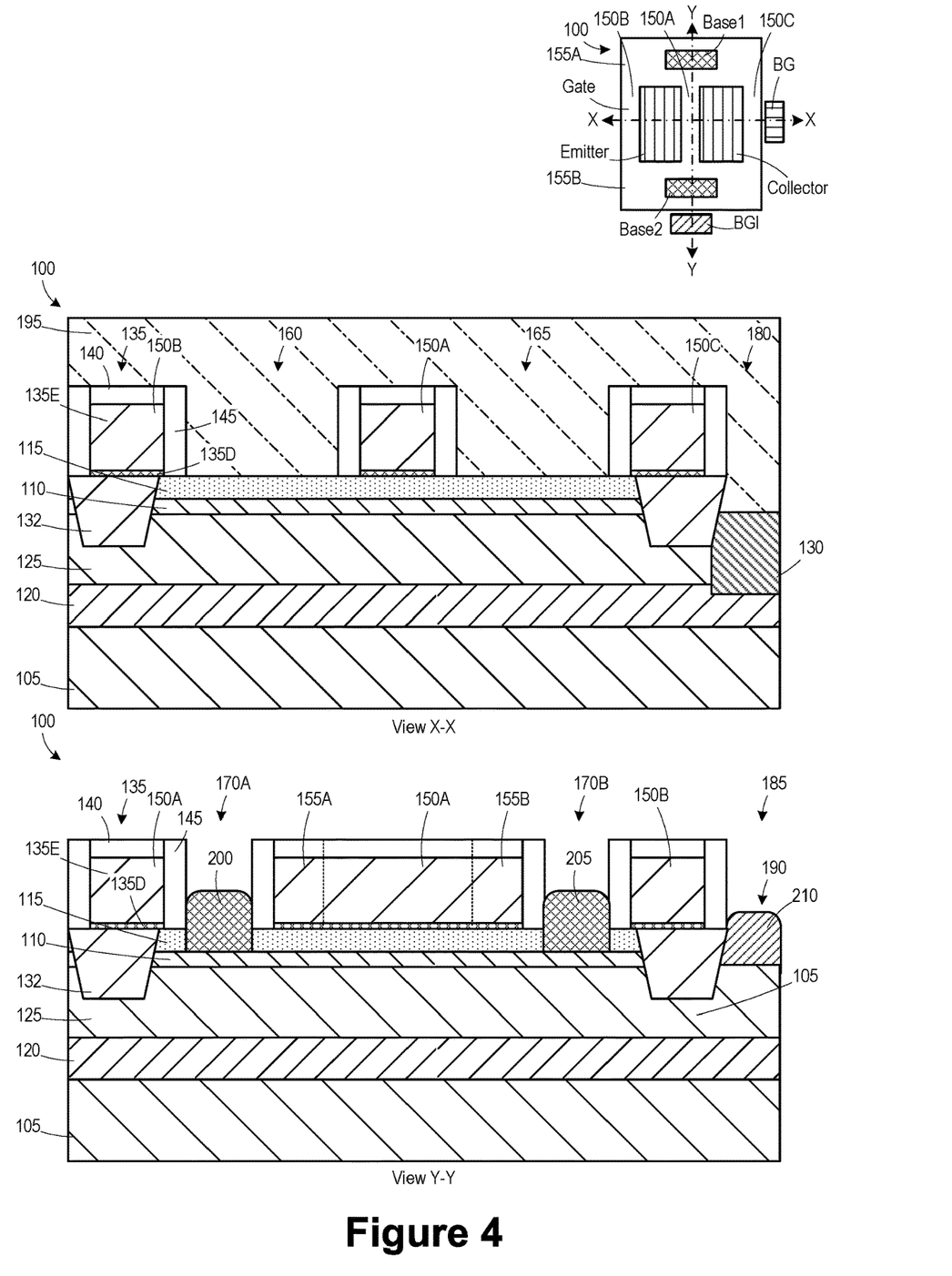

FIG. 4 illustrates the bipolar transistor device 100 after the mask layer 175 was removed and a mask layer 195 was formed above the bipolar transistor device 100 and patterned to cover the emitter region 160, the collector region 165, and the well isolation contact 130 while exposing the base regions 170A, 170B and the back gate contact region 190. In some embodiments, the mask layer 195 includes one or more layers of a photolithography patterning stack, including a photoresist layer, an organic patterning layer (OPL), a hard bottom anti-reflective coating (BARC) layer, a hard mask layer. etc. One or more processes were performed to define a first base contact 200, a second base contact 205, and a back gate contact 210. In some embodiments, the first base contact 200, the second base contact 205, and the back gate contact 210 were formed by recessing the active semiconductor layer 115 and the bulk substrate layer 105 and epitaxially growing the first base contact 200, the second base contact 205, and the back gate contact 210. The epitaxially-grown material may be doped in situ (P+). In some embodiments, the first base contact 200, the second base contact 205, and the back gate contact 210 were formed by implanting dopants (P+) into the active semiconductor layer 115 and the bulk substrate layer 105 exposed by the mask layer 195. In some embodiments, a combination of implantation and epitaxial growth processes are used. In some embodiments, the first base contact 200, the second base contact 205, and the back gate contact 210 are formed from silicon germanium.

Figure 5:
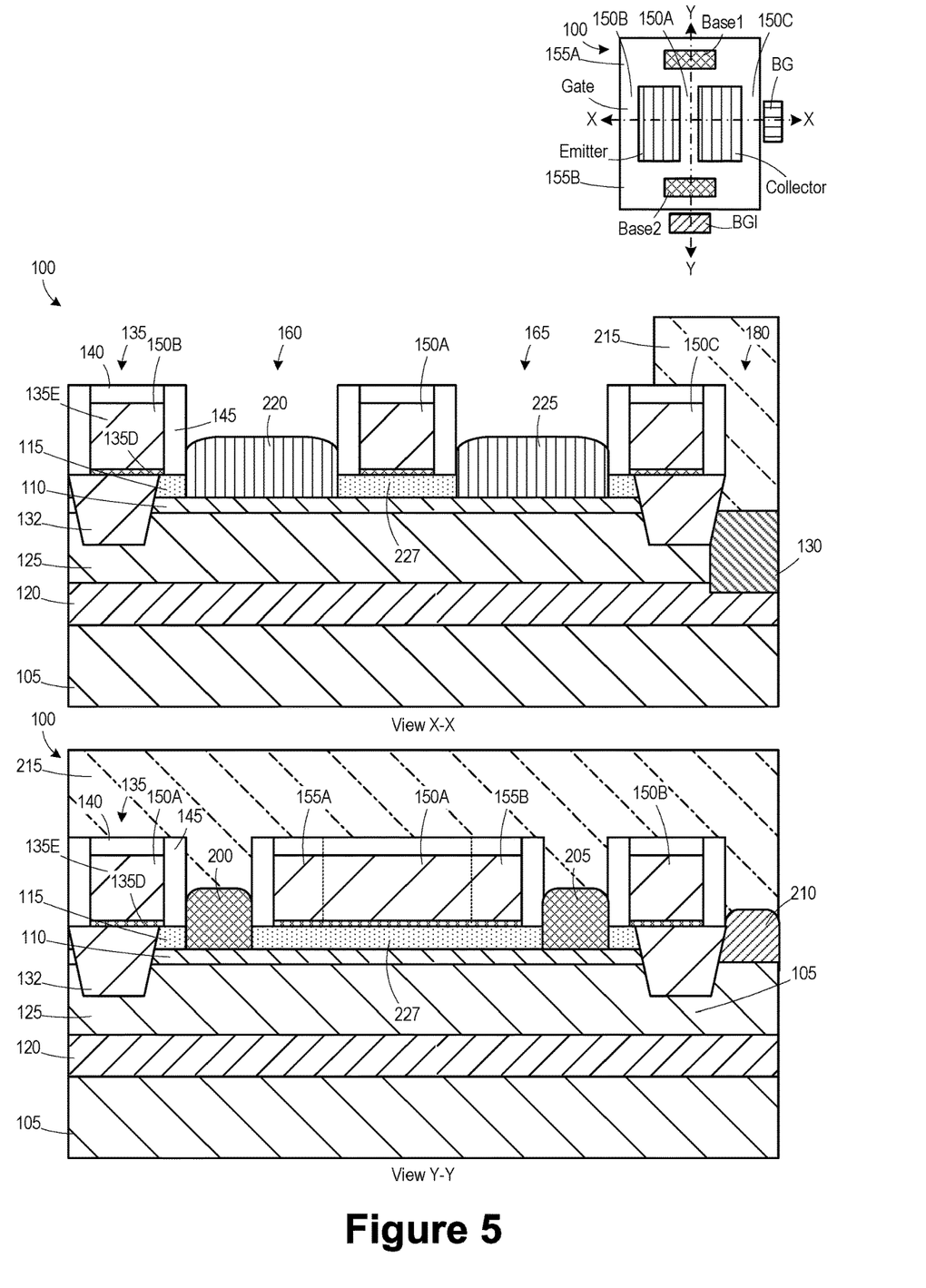

FIG. 5 illustrates the bipolar transistor device 100 after the mask layer 195 was removed and a mask layer 215 was formed above the bipolar transistor device 100 and patterned to cover the base contacts 200, 205, the back gate contact 210, and the back gate isolation contact 130 while exposing the emitter region 160 and the collector region 165. In some embodiments, the mask layer 215 includes one or more layers of a photolithography patterning stack, including a photoresist layer, an organic patterning layer (OPL), a hard bottom anti-reflective coating (BARC) layer, a hard mask layer. etc. One or more processes were performed to define an emitter 220 and a collector 225. A base 227 is defined between the emitter 220 and the collector 225. The size of the base 227 is defined by the gate structure 135. The width of the first line 150A defines the separation between the emitter 220 and the collector 225, thereby defining the size of the base 227. The base contacts 200, 205 contact the portion of the active semiconductor layer 115 including the base 227.

In some embodiments, the emitter 220 and the collector 225 were formed by recessing the active semiconductor layer 115 and epitaxially growing the emitter 220 and the collector 225. The epitaxially-grown material may be doped in situ (N+). In some embodiments, the emitter 220 and the collector 225 were formed by implanting dopants (N+) into the active semiconductor layer 115 exposed by the mask layer 195. In some embodiments, a combination of implantation and epitaxial growth processes may be used. In some embodiments, the emitter 220 and the collector 225 are silicon germanium. In some embodiments, the portion of the active semiconductor layer 115 between the emitter 220 and the collector 225 is silicon germanium.

Figure 6:
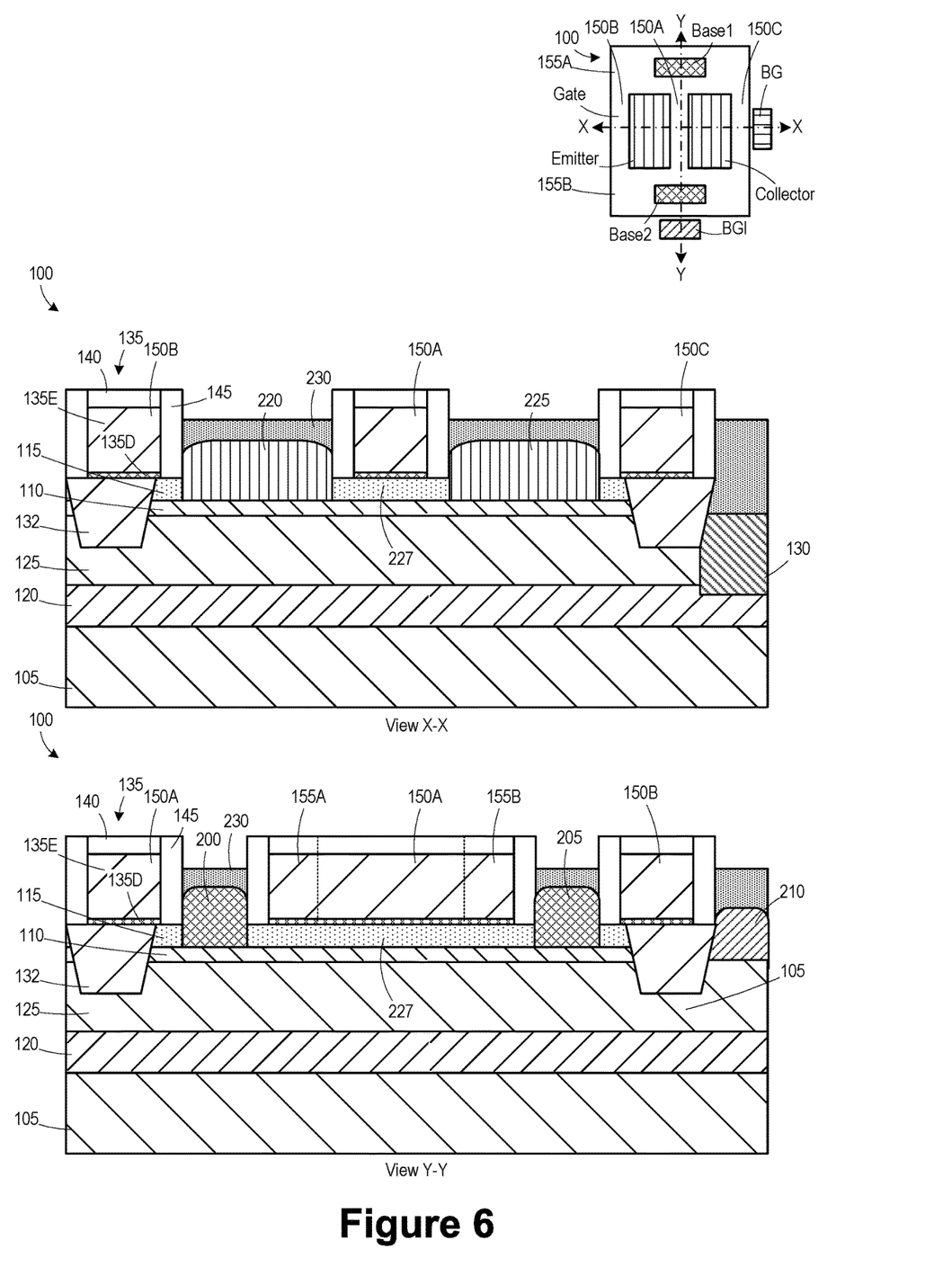

FIG. 6 illustrates the bipolar transistor device 100 after the mask layer 215 was removed and a silicide layer 230 was formed above the base contacts 200, 205, the back gate contact 210, the back gate isolation contact 130, the emitter 220, and the collector 225. In some embodiments, the silicide layer 230 was formed by depositing a conformal layer of a refractory metal (e.g., nickel, platinum, cobalt, or other suitable material) over the bipolar transistor device 100 and performing an annealing process to cause the refractory metal to react with underlying silicon-containing material to form a metal silicide. An etch process was performed to remove unreacted portions of the layer of refractory metal. In some embodiments, an additional annealing process is performed to form the final phase of the metal silicide. In some embodiments, the silicide formation process consumes some of the material of the underlying semiconductor material.

Figure 7:
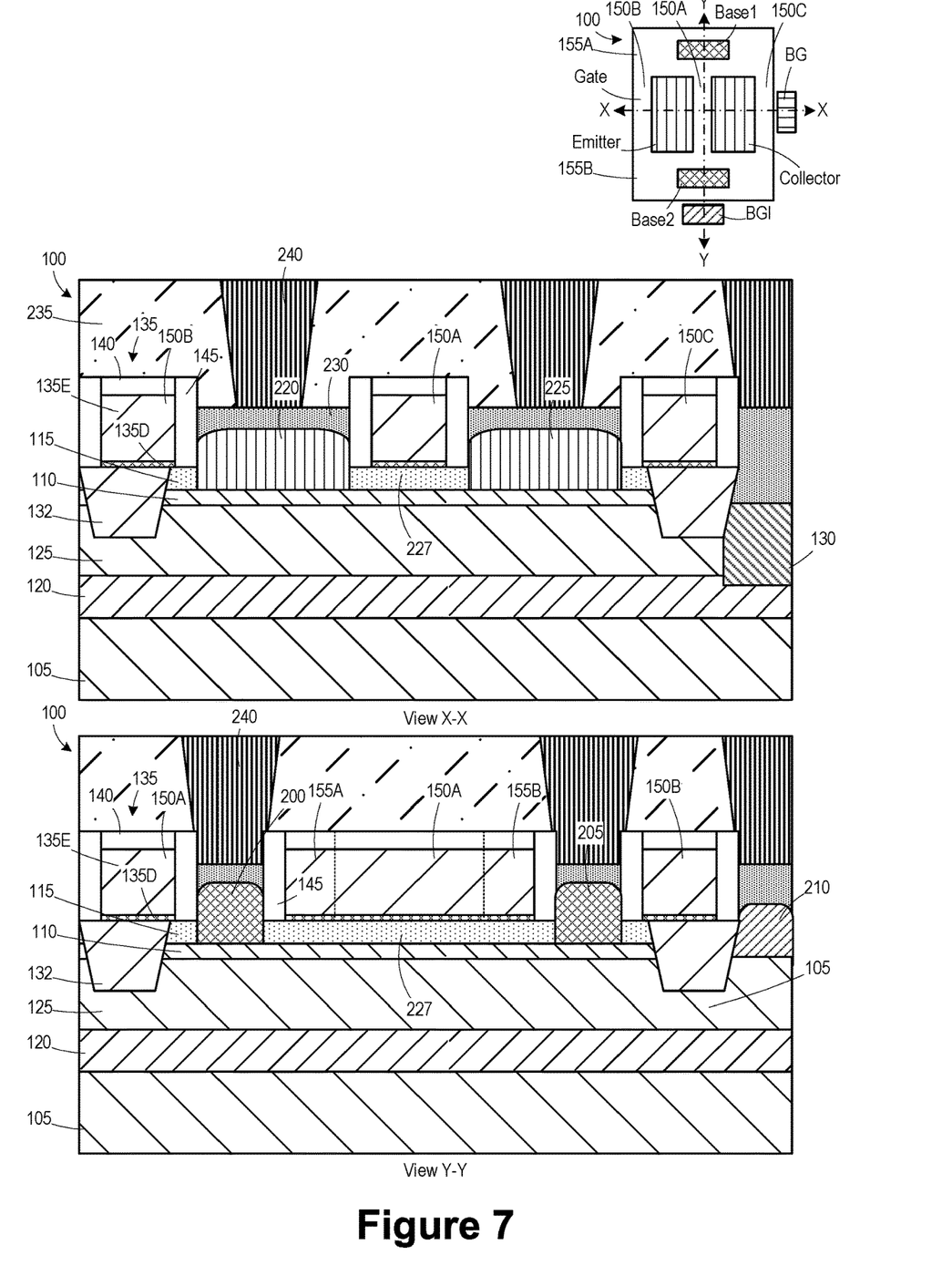

FIG. 7 illustrates the bipolar transistor device 100 after several processes were performed to form a dielectric layer 235 (e.g., silicon dioxide, low-k dielectric, ultra-low-k dielectric, etc.) over the gate structure 135, the base contacts 200, 205, the back gate contact 210, the back gate isolation contact 130, the emitter 220, and the collector 225 and contacts 240 were formed embedded in the dielectric layer 235 to contact the base contacts 200, 205, the back gate contact 210, the back gate isolation contact 130, the emitter 220, and the collector 225.

In some embodiments, a first bias voltage may be applied to the back gate contact 210 to bias the back gate region 125 and affect the threshold voltage of the bipolar transistor device 100. In some embodiments, a second bias voltage may be applied to the back gate isolation contact 130 to increase isolation between the back gate region 125 and the bulk substrate layer 105. The back gate bias also affects the performance of the bipolar transistor device 100. In some embodiments, the gate structure 135 is a "dummy" gate structure in that a gate voltage is not applied to the gate structure 135 during operation of the bipolar transistor device 100. The gate structure 135 is left in a floating state.

Figure 8:
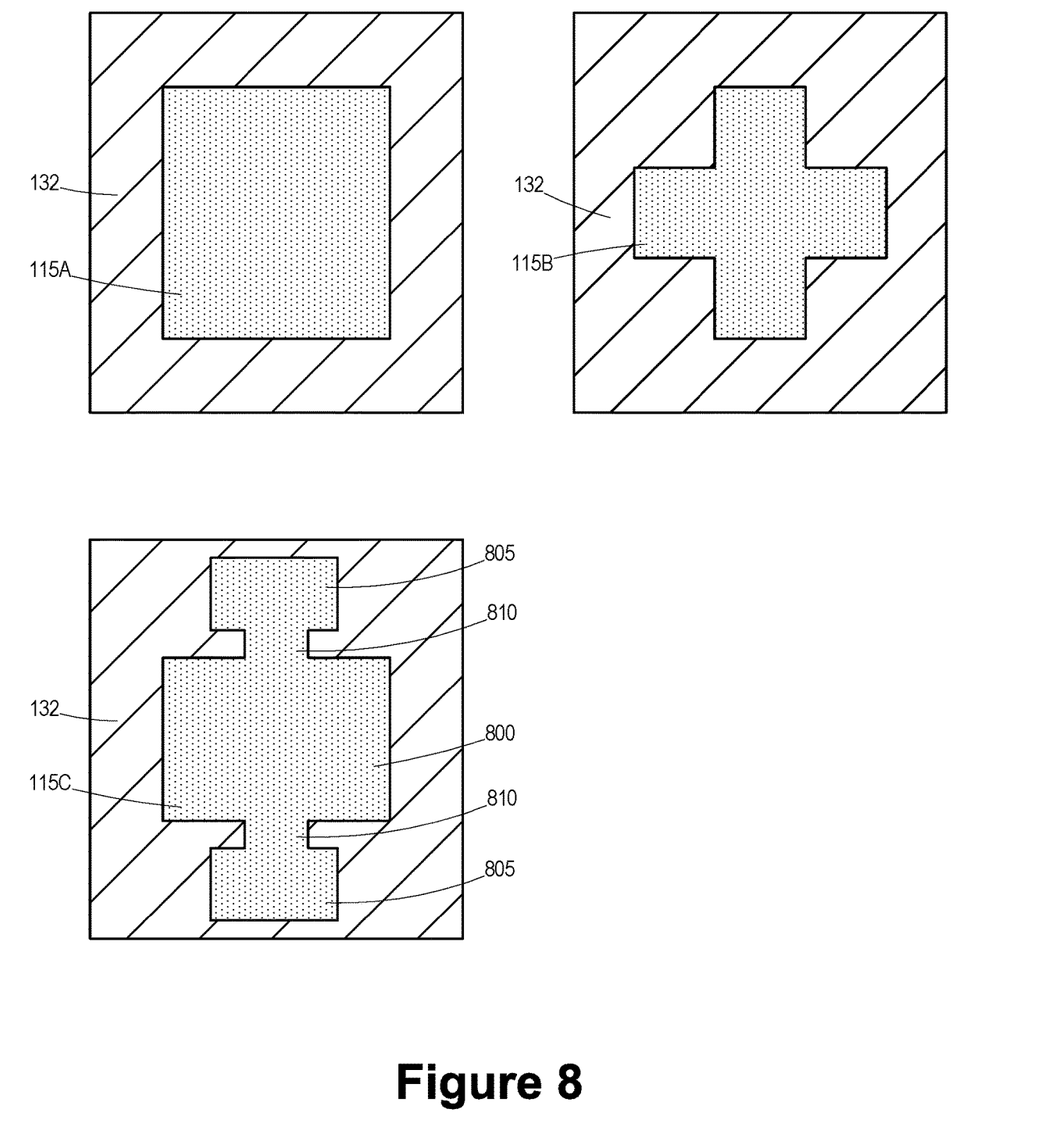
FIG. 8 illustrates alternative embodiments for shapes of the active semiconductor layer.

FIG. 8 illustrates various embodiments of shapes for the active semiconductor layer 115 as defined by the isolation structure 132. In some embodiments, the active semiconductor layer 115A has a rectangular horizontal cross-section viewed from above. In some embodiments, the active semiconductor layer 115B has a cross-shaped horizontal cross-section viewed from above. The cross-shaped horizontal cross-section reduces a collector-to-base and an emitter-to-base parasitic leakage current. In some embodiments, the horizontal cross-section of the active semiconductor layer 115C includes a rectangular portion 800 for the emitter and the collector and dumbbell portions 805 for the base contacts. In some embodiments, a neck portion 810 of the dumbbell portions 805 has a width corresponding to a width of the first line 150A of the gate structure 135. The dumbbell-shaped horizontal cross-section reduces a collector-to-base and an emitter-to-base parasitic leakage current.

Figure 9:
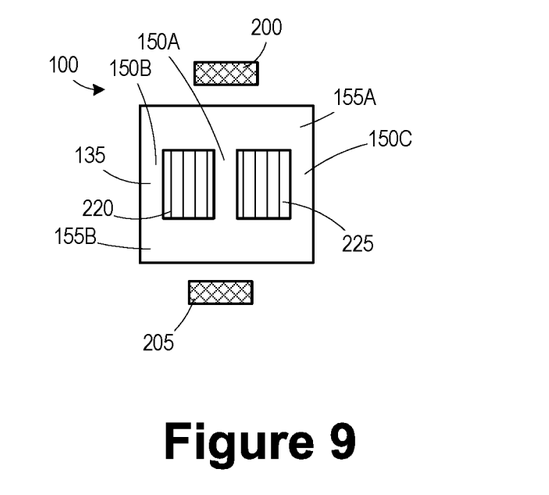
FIG. 9 illustrates an alternative embodiment for the gate structure and base contact location.

FIG. 9 is a diagram of an alternative layout for the bipolar transistor device 100. The gate structure 135 defines the emitter 220 and the collector 225, where the emitter 220 and the collector 225 are separated by the first line 150A of the gate structure. The base contacts 200, 205 are displaced from the block portions 155A. 155B of the gate structure 135 in portions of the active semiconductor layer 115 not covered by the gate structure 135. For example, the cross-shaped horizontal cross-section of the active semiconductor layer 115B or the dumbbell-shaped horizontal cross-section of the active semiconductor layer 115C shown FIG. 8 may be used. The mask layer 195 of FIG. 4 may be formed to expose regions of the active semiconductor layer 115 where the base contacts 200, 205 are formed.

Figure 10:
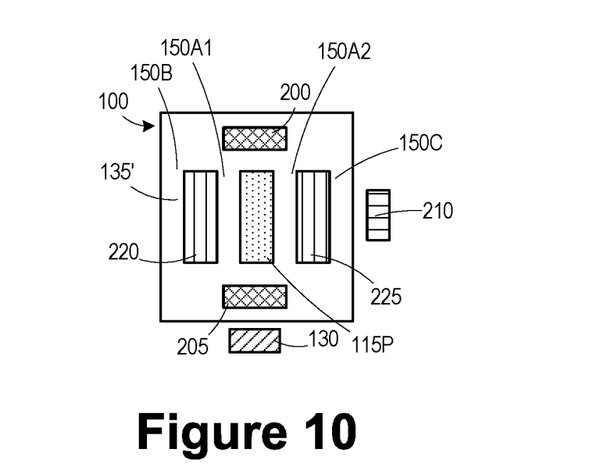
FIG. 10 illustrates an alternative embodiment for the gate structure.

FIG. 10 is a diagram of an alternative embodiment of the gate structure 135'. The gate structure 135' includes at least two lines 150A1, 150A2 positioned between the lines 150B, 150C. The combination of the lines 150A1, 150A2 defines the separation between the emitter 220 and the collector 225. The portion 115P of the active semiconductor layer 115 between the lines 150A1, 150A2 may be masked during the formation of the base contacts 200, 205, the emitter 220, and the collector 225. The lines 150A1, 150A2 provide flexibility in defining the width of the base region between the emitter 220 and the collector 225.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
   a first gate structure above an active semiconductor layer;
   a second gate structure adjacent a first side of the first gate structure;
   a third gate structure adjacent a second side of the first gate structure;
   an emitter of a bipolar transistor positioned in the active semiconductor layer between the first gate structure and the second gate structure;
   a collector of the bipolar transistor positioned in the active semiconductor layer between the first gate structure and the third gate structure;
   a first base contact contacting the active semiconductor layer adjacent an end of the first gate structure, wherein a portion of the active semiconductor layer positioned under the first gate structure defines a base of the bipolar transistor; and
   a first gate structure block portion positioned adjacent first ends of the first, second, and third gate structures; and
   a second gate structure block portion positioned adjacent second ends of the first, second, and third gate structures.

2. The device of claim 1, wherein the first base contact is embedded in the first gate structure block portion.

3. The device of claim 2, further comprising a second base contact embedded in the second gate structure block portion.

4. The device of claim 1, wherein the emitter comprises a first raised portion, the collector comprises a second raised portion, and the base contact comprises a third raised portion.

5. The device of claim 1, wherein the active region has a cross-shaped horizontal cross-section.

6. The device of claim 1, wherein the active region has a dumbbell-shaped horizontal cross-section.

7. The device of claim 1, further comprising silicide regions positioned on the base, the emitter, and the first base contact.

8. A method, comprising:
   forming a first gate structure above an active semiconductor layer;
   forming a second gate structure adjacent a first side of the first gate structure;
   forming a third gate structure adjacent a second side of the first gate structure;
   forming an emitter of a bipolar transistor in the active semiconductor layer between the first gate structure and the second gate structure;
   forming a collector of the bipolar transistor in the active semiconductor layer between the first gate structure and the third gate structure;
   forming a first base contact contacting the active semiconductor layer adjacent an end of the first gate structure, wherein a portion of the active semiconductor layer positioned under the first gate structure defines a base of the bipolar transistor; and
   forming a first gate structure block portion positioned adjacent first ends of the first, second, and third gate structures; and
   forming a second gate structure block portion positioned adjacent second ends of the first, second, and third gate structures.

9. The method of claim 8, wherein the first gate structure block portion defines a first opening exposing a first region of the active semiconductor layer, and the method comprises:
   forming a mask layer exposing the first region of the active semiconductor layer;
   recessing the active semiconductor layer in the first region; and
   epitaxially growing the first base contact in the first region.

10. The method of claim 9, wherein the second gate structure block portion defines a second opening exposing a second region of the active semiconductor layer, and the method comprises:
    forming the mask layer to expose the second region of the active semiconductor layer;
    recessing the active semiconductor layer in the second region; and
    epitaxially growing a second base contact in the second region contacting the active region.

11. The method of claim 10, further comprising forming a silicide layer on the first and second base contacts.

12. The method of claim 8, wherein forming the emitter and forming the collector comprises:
    forming a mask layer exposing a first region of the active semiconductor layer between the first gate structure and the second gate structure and a second region of the active semiconductor layer between the first gate structure and the third gate structure;
    recessing the active semiconductor layer in the first and second regions; and
    epitaxially growing the emitter in the first region and the collector in the second region.

13. The method of claim 12, further comprising forming a silicide layer on the emitter and the collector.

14. A method, comprising:
    forming a gate structure above an active semiconductor layer, wherein the gate structure comprises a first line portion, a first block portion positioned on a first end of the first line portion, and a second block portion positioned on a second end of the first line portion, wherein the first block portion defines a first opening exposing the active semiconductor layer;
    forming a first base contact in the first opening;
    forming an emitter of a bipolar transistor adjacent a first side of the first line portion; and
    forming a collector of the bipolar transistor adjacent a second side of the first line portion, wherein a portion of the active semiconductor layer positioned under the first line portion defines a base of the bipolar transistor; and
    forming a second line portion of the gate structure extending between the first block portion and the second block portion, wherein the emitter is formed between the first line portion and the second line portion; and
    forming a third line portion of the gate structure extending between the first block portion and the second block portion, wherein the collector is formed between the first line portion and the third line portion.

15. The method of claim 14, wherein forming the emitter and forming the collector comprises:
    forming a mask layer exposing a first region of the active semiconductor layer between the first line portion and the second line portion and a second region of the active semiconductor layer between the first line portion and the third line portion;

recessing the active semiconductor layer in the first and second regions; and epitaxially growing the emitter in the first region and the collector in the second region.

16. The method of claim 14, further comprising forming a silicide layer on the emitter and the collector.

17. The method of claim 14, further comprising forming a silicide layer on the first base contact.

* * * * *